(12) United States Patent
Bendel

(10) Patent No.: US 11,300,531 B2
(45) Date of Patent: Apr. 12, 2022

(54) ACCURATE WATER CUT MEASUREMENT

(71) Applicant: ASPECT AI LTD., Shoham (IL)

(72) Inventor: Peter Bendel, Rishon LeZion (IL)

(73) Assignee: ASPECT AI LTD., Shoham (IL)

( * ) Notice: Subject to any disclaimer, the term of this patent is extended or adjusted under 35 U.S.C. 154(b) by 1433 days.

(21) Appl. No.: 14/746,999

(22) Filed: Jun. 23, 2015

(65) Prior Publication Data

US 2015/0377998 A1 Dec. 31, 2015

Related U.S. Application Data

(60) Provisional application No. 62/016,680, filed on Jun. 25, 2014.

(51) Int. Cl.
| | | |
|---|---|---|
| *G01N 24/08* | (2006.01) | |
| *E21B 49/00* | (2006.01) | |
| *G01R 33/44* | (2006.01) | |
| *G01V 3/32* | (2006.01) | |

(52) U.S. Cl.
CPC .......... *G01N 24/081* (2013.01); *E21B 49/00* (2013.01); *G01R 33/448* (2013.01); *G01V 3/32* (2013.01)

(58) Field of Classification Search
CPC .... G01N 24/081; E21B 49/00; G01R 33/448; G01V 3/32
See application file for complete search history.

(56) References Cited

U.S. PATENT DOCUMENTS

| | | | |
|---|---|---|---|
| 238,631 | A | 3/1881 | Ball |
| 406,968 | A | 7/1889 | Tesla |
| 2,239,144 | A | 4/1941 | Dean et al. |
| 2,323,837 | A | 7/1943 | Neal |
| 3,243,238 | A | 3/1966 | Lyman |
| 3,512,852 | A | 5/1970 | North |
| 3,815,963 | A | 6/1974 | Wilk |
| 3,888,553 | A | 6/1975 | Wehde |
| 4,222,021 | A | 9/1980 | Bunker, Jr. |

(Continued)

FOREIGN PATENT DOCUMENTS

| | | |
|---|---|---|
| CN | 1318503 | 10/2001 |
| CN | 103411991 | 11/2013 |

(Continued)

OTHER PUBLICATIONS

Berry et al., Of flying frogs and levitrons, Eur. J. Phys. 1997, 18, 307-313.

(Continued)

*Primary Examiner* — Dixomara Vargas

(74) *Attorney, Agent, or Firm* — Loeb & Loeb LLP

(57) ABSTRACT

A method of incorporating the influence of diffusion into the CPMG-based T2 measurement for one or more of the following: water cut measurement; performing inline measurements of flow rate; density; and rheology of a flowing fluid. The method includes conducting a "standard T1/T2 experiment" at least twice by providing one scan without a field gradient during the CMPG echo train. Then, providing a second scan with the application of a gradient, where in the second experiment the measured T2 ($T2_{app}$) is affected solely by water diffusion, thus shifting cross peaks which represent water on the first T1/T2 spectrum to lower T2 values on the second spectrum.

5 Claims, 4 Drawing Sheets

Gradient (a)

Gradient (b)

(56) References Cited

U.S. PATENT DOCUMENTS

| | | | |
|---|---|---|---|
| 4,379,598 A | 4/1983 | Goldowsky | |
| 4,382,245 A | 5/1983 | Harrigan | |
| 4,417,474 A | 11/1983 | Elderton | |
| 4,492,875 A | 1/1985 | Rowe | |
| 4,514,691 A | 4/1985 | De Los Santos et al. | |
| 4,517,514 A | 5/1985 | Howell | |
| 4,585,282 A | 4/1986 | Bosley | |
| 4,697,594 A | 10/1987 | Mayo, Jr. | |
| 4,761,579 A | 8/1988 | Delassus | |
| 4,785,245 A | 11/1988 | Lew et al. | |
| 4,933,638 A | 6/1990 | Kleinberg et al. | |
| 5,168,226 A | 12/1992 | Hinks | |
| 5,208,534 A | 5/1993 | Okamoto | |
| 5,268,640 A | 12/1993 | Du et al. | |
| 5,371,464 A | 12/1994 | Rapoport | |
| 5,410,199 A | 4/1995 | Kinugasa et al. | |
| 5,450,010 A | 9/1995 | Van Der Meulen et al. | |
| 5,479,925 A | 1/1996 | Dumoulin et al. | |
| 5,490,513 A | 2/1996 | Damadian et al. | |
| 5,497,087 A | 3/1996 | Vinegar et al. | |
| 5,498,960 A | 3/1996 | Vinegar et al. | |
| 5,506,558 A | 4/1996 | Laube | |
| 5,519,319 A | 5/1996 | Smith et al. | |
| 5,532,593 A | 7/1996 | Maneval et al. | |
| 5,596,275 A | 1/1997 | Dechene et al. | |
| 5,675,253 A | 10/1997 | Smith et al. | |
| 5,685,300 A | 11/1997 | Kuenstner | |
| 5,705,928 A | 1/1998 | Haner et al. | |
| 5,744,957 A | 4/1998 | Vaughan, Jr. | |
| 5,827,952 A | 10/1998 | Mansure | |
| 5,838,155 A | 11/1998 | Bowers | |
| 6,069,106 A | 5/2000 | Hettinger, Jr. | |
| 6,175,175 B1 | 1/2001 | Hull | |
| 6,232,671 B1 | 5/2001 | Gottfried, Jr. | |
| 6,278,891 B1 | 8/2001 | Reiderman et al. | |
| 6,302,579 B1 | 10/2001 | Meyer et al. | |
| 6,333,629 B1 | 12/2001 | Pykett et al. | |
| 6,351,049 B1 | 2/2002 | Chassoulier et al. | |
| 6,375,996 B1 | 4/2002 | Suter et al. | |
| 6,380,737 B1 | 4/2002 | Myles | |
| 6,412,337 B1 | 7/2002 | Arzate | |
| 6,522,145 B1 | 2/2003 | Damadian et al. | |
| 6,549,007 B1 | 4/2003 | Hills et al. | |
| 6,549,799 B2 | 4/2003 | Bock et al. | |
| 6,550,327 B1 | 4/2003 | Van Berk | |
| 6,563,315 B1 | 5/2003 | Boskamp et al. | |
| 6,570,382 B1* | 5/2003 | Hurlimann | G01N 24/081 324/303 |
| 6,643,799 B1 | 11/2003 | Bonissone et al. | |
| 6,668,403 B2 | 12/2003 | Seufert | |
| 6,737,864 B2 | 5/2004 | Prammer et al. | |
| 6,771,069 B2 | 8/2004 | Asano et al. | |
| 6,807,857 B2 | 10/2004 | Storm, Jr. | |
| 6,856,132 B2 | 2/2005 | Appel | |
| 6,859,033 B2* | 2/2005 | Speier | G01V 3/32 324/303 |
| 6,879,076 B2 | 4/2005 | Long | |
| 6,883,702 B2* | 4/2005 | Hurlimann | G01V 3/32 324/303 |
| 6,898,970 B2 | 5/2005 | Berstis | |
| 6,972,565 B2 | 12/2005 | Yokoi et al. | |
| 7,023,122 B2 | 4/2006 | Gang | |
| 7,034,528 B2* | 4/2006 | Minh | G01N 24/081 324/303 |
| 7,053,611 B2* | 5/2006 | Freedman | G01V 3/32 324/303 |
| 7,057,156 B2 | 6/2006 | Coates et al. | |
| 7,084,627 B2 | 8/2006 | McKendry et al. | |
| 7,127,499 B1 | 10/2006 | Accardi et al. | |
| 7,345,478 B2 | 3/2008 | Lieblich et al. | |
| 7,355,402 B1 | 4/2008 | Taicher et al. | |
| 7,388,374 B2* | 6/2008 | Minh | G01N 24/081 324/303 |
| 7,394,183 B2 | 7/2008 | Ramer | |
| 7,397,241 B2 | 7/2008 | Gauthausen et al. | |
| 7,400,147 B2 | 7/2008 | Rapoport | |
| 7,501,922 B2 | 3/2009 | Kazadi | |
| 7,511,487 B2* | 3/2009 | Badry | G01N 24/081 324/303 |
| 7,764,064 B2 | 7/2010 | Reiss et al. | |
| 7,880,467 B2 | 2/2011 | Rapoport | |
| 7,921,731 B2 | 4/2011 | Bajikar | |
| 8,024,962 B2 | 9/2011 | Tonmukayakul | |
| 8,185,315 B2 | 5/2012 | Coope et al. | |
| 8,427,145 B2* | 4/2013 | Mitchell | G01N 24/081 324/303 |
| 8,519,708 B2 | 8/2013 | Prado et al. | |
| 8,686,724 B2* | 4/2014 | Mitchell | G01N 24/081 324/303 |
| 8,736,263 B2 | 5/2014 | Minh | |
| 8,766,631 B2 | 7/2014 | Hofmann et al. | |
| 8,807,084 B2 | 8/2014 | Rapoport et al. | |
| 8,820,226 B2 | 9/2014 | Milla et al. | |
| 8,851,018 B2 | 10/2014 | Rapoport et al. | |
| 8,896,310 B2 | 11/2014 | Rapoport | |
| 8,917,918 B2 | 12/2014 | Jellus et al. | |
| 9,006,914 B2 | 4/2015 | Rapoport | |
| 9,476,847 B2 | 10/2016 | Trygstad | |
| 9,617,831 B2 | 4/2017 | Jones | |
| 2002/0030491 A1 | 3/2002 | Kose | |
| 2002/0048610 A1 | 4/2002 | Cima et al. | |
| 2003/0006768 A1 | 1/2003 | Kleinberg | |
| 2003/0169040 A1* | 9/2003 | Hurlimann | G01V 3/32 324/303 |
| 2003/0178994 A1* | 9/2003 | Hurlimann | G01N 24/081 324/303 |
| 2003/0197433 A1 | 10/2003 | Cheung et al. | |
| 2004/0017193 A1 | 1/2004 | Speier | |
| 2004/0058559 A1 | 3/2004 | Govindarajan et al. | |
| 2004/0090231 A1 | 5/2004 | Augustine et al. | |
| 2004/0140875 A1 | 7/2004 | Strom | |
| 2004/0164735 A1* | 8/2004 | Hurlimann | G01N 24/081 324/303 |
| 2004/0169511 A1* | 9/2004 | Minh | G01N 24/081 324/303 |
| 2004/0169512 A1 | 9/2004 | Jara | |
| 2005/0203420 A1 | 9/2005 | Kleen | |
| 2005/0270023 A1* | 12/2005 | Freedman | G01V 3/32 324/303 |
| 2006/0001323 A1 | 1/2006 | Gang | |
| 2007/0096603 A1 | 5/2007 | Ramer | |
| 2007/0164737 A1 | 7/2007 | Pusiol | |
| 2008/0257413 A1 | 10/2008 | Noureldin | |
| 2009/0004748 A1 | 1/2009 | Ganesan | |
| 2009/0044638 A1 | 2/2009 | Gysling | |
| 2009/0050318 A1 | 2/2009 | Kasevich | |
| 2009/0090504 A1 | 4/2009 | Weightman | |
| 2009/0115416 A1 | 5/2009 | White et al. | |
| 2009/0167033 A1 | 7/2009 | Rapoport | |
| 2009/0167322 A1 | 7/2009 | Magnuson et al. | |
| 2009/0312963 A1 | 12/2009 | Najim Al-Khamis | |
| 2009/0312964 A1 | 12/2009 | Najim Al-Khamis | |
| 2010/0133488 A1 | 6/2010 | Giakos | |
| 2010/0237860 A1* | 9/2010 | Hurlimann | G01N 24/081 324/303 |
| 2010/0271019 A1 | 10/2010 | Anand | |
| 2010/0288093 A1 | 11/2010 | Seager et al. | |
| 2011/0036584 A1 | 2/2011 | Weightman | |
| 2011/0162652 A1 | 7/2011 | Rapoport | |
| 2011/0185795 A1 | 8/2011 | Colquhoun | |
| 2011/0186049 A1 | 8/2011 | Rapoport | |
| 2011/0234220 A1* | 9/2011 | Mitchell | G01N 24/081 324/303 |
| 2011/0234347 A1 | 9/2011 | Rapoport | |
| 2011/0296911 A1 | 12/2011 | Moore | |
| 2011/0304333 A1 | 12/2011 | Rapoport | |
| 2012/0013335 A1 | 1/2012 | Saasen | |
| 2012/0062226 A1 | 3/2012 | Pielak et al. | |
| 2012/0065491 A1 | 3/2012 | Borgert | |
| 2012/0071745 A1 | 3/2012 | Rapoport | |
| 2012/0073511 A1 | 3/2012 | Rapoport et al. | |
| 2012/0077707 A1 | 3/2012 | Rapoport | |

(56) References Cited

U.S. PATENT DOCUMENTS

| | | |
|---|---|---|
| 2012/0092007 A1 | 4/2012 | Li |
| 2012/0119742 A1 | 5/2012 | Rapoport |
| 2012/0133358 A1 | 5/2012 | Broz |
| 2012/0169069 A1 | 7/2012 | Rapoport |
| 2012/0205288 A1 | 8/2012 | Jia |
| 2012/0265050 A1 | 10/2012 | Wang |
| 2013/0009959 A1 | 1/2013 | Calamante |
| 2013/0057277 A1* | 3/2013 | Zielinski .................. G01V 3/32 324/303 |
| 2013/0079624 A1 | 3/2013 | Rapoport |
| 2013/0109956 A1 | 5/2013 | Rapoport |
| 2013/0124106 A1 | 5/2013 | Rogel |
| 2013/0154644 A1 | 6/2013 | Sami |
| 2013/0230223 A1 | 9/2013 | Jellus et al. |
| 2013/0237803 A1 | 9/2013 | Rapoport |
| 2013/0265055 A1* | 10/2013 | Mitchell .............. G01N 24/081 324/322 |
| 2013/0328559 A1 | 12/2013 | Rapoport |
| 2013/0328560 A1 | 12/2013 | Rapoport |
| 2013/0328563 A1 | 12/2013 | Rapoport |
| 2013/0345994 A1 | 12/2013 | Wiklund |
| 2014/0049257 A1 | 2/2014 | Rapoport |
| 2014/0050824 A1 | 2/2014 | Rapoport |
| 2014/0050827 A1 | 2/2014 | Rapoport |
| 2014/0051973 A1 | 2/2014 | Rapoport et al. |
| 2014/0051974 A1 | 2/2014 | Rapoport et al. |
| 2014/0051976 A1 | 2/2014 | Rapoport et al. |
| 2014/0099010 A1 | 4/2014 | Rapoport |
| 2014/0103927 A1 | 4/2014 | Rapoport |
| 2014/0117989 A1 | 5/2014 | Rapoport |
| 2014/0128725 A1 | 5/2014 | Rapoport |
| 2014/0139216 A1 | 5/2014 | Rapoport |
| 2014/0142914 A1 | 5/2014 | Rapoport |
| 2014/0152302 A1 | 6/2014 | Rapoport et al. |
| 2014/0152310 A1 | 6/2014 | Rapoport |
| 2014/0158062 A1 | 6/2014 | Rapoport et al. |
| 2014/0167756 A1 | 6/2014 | Cho et al. |
| 2014/0230850 A1 | 8/2014 | Rapoport |
| 2014/0253116 A1 | 9/2014 | Freedman |
| 2014/0257081 A1 | 9/2014 | Rapoport |
| 2014/0262957 A1 | 9/2014 | Gong |
| 2014/0266203 A1 | 9/2014 | Rapoport |
| 2014/0285196 A1* | 9/2014 | Liu ...................... G01N 24/081 324/309 |
| 2014/0300358 A1 | 10/2014 | Rapoport |
| 2014/0309951 A1 | 10/2014 | Alvarez Vallejos |
| 2014/0320126 A1* | 10/2014 | Heaton .................. G01V 11/00 324/303 |
| 2014/0353503 A1 | 12/2014 | Lanan et al. |
| 2014/0354299 A1 | 12/2014 | Rapoport |
| 2014/0378821 A1 | 12/2014 | Rapoport et al. |
| 2014/0378825 A1 | 12/2014 | Rapoport et al. |
| 2015/0059157 A1 | 3/2015 | Rapoport |
| 2015/0059655 A1 | 3/2015 | Rapoport |
| 2015/0065788 A1 | 3/2015 | Rapoport |
| 2015/0073204 A1 | 3/2015 | Rapoport |
| 2015/0084630 A1 | 3/2015 | Rapoport |
| 2015/0087051 A1 | 3/2015 | Rapoport |
| 2015/0112186 A1 | 4/2015 | Rapoport et al. |
| 2015/0126804 A1 | 5/2015 | Rapoport |
| 2015/0130460 A1* | 5/2015 | Valori .................. G01N 24/081 324/309 |
| 2015/0137812 A1 | 5/2015 | Rapoport |
| 2015/0141799 A1 | 5/2015 | Rapoport et al. |
| 2015/0159471 A1 | 6/2015 | Jones |
| 2015/0160311 A1 | 6/2015 | Rapoport et al. |
| 2015/0168519 A1 | 6/2015 | Rapoport |
| 2015/0231012 A1 | 8/2015 | Rapoport |
| 2015/0253397 A1 | 9/2015 | Rapoport |
| 2015/0253400 A1 | 9/2015 | Rapoport |
| 2015/0253401 A1 | 9/2015 | Rapoport |
| 2015/0253454 A1 | 9/2015 | Song et al. |
| 2015/0377998 A1 | 12/2015 | Bendel |
| 2016/0011290 A1* | 1/2016 | Iannello .................. A61B 5/055 600/309 |
| 2016/0053187 A1 | 2/2016 | Hayasaka |
| 2016/0077171 A1 | 3/2016 | Rabinovitz et al. |
| 2016/0077176 A1 | 3/2016 | Rabinovitz et al. |
| 2016/0108687 A1 | 4/2016 | Rapoport |
| 2016/0116540 A1 | 4/2016 | Zheng et al. |
| 2018/0058180 A1 | 3/2018 | Jones |
| 2018/0238819 A1 | 8/2018 | Rapoport |

FOREIGN PATENT DOCUMENTS

| | | |
|---|---|---|
| DE | 102010021260 | 11/2011 |
| EP | 0584112 | 11/1999 |
| EP | 1253433 | 10/2002 |
| EP | 2345330 | 7/2011 |
| EP | 2732046 | 5/2014 |
| GB | 2120075 | 11/1983 |
| GB | 2397698 | 7/2004 |
| JP | 2110358 | 4/1990 |
| JP | 07-198636 | 8/1995 |
| JP | 2558727 | 9/1996 |
| JP | 09-297113 | 11/1997 |
| JP | 11-142354 | 5/1999 |
| JP | 2002501204 | 1/2002 |
| JP | 2002122418 | 4/2002 |
| JP | 2006149164 | 6/2006 |
| JP | 2007100124 | 4/2007 |
| RU | 2177201 | 12/2001 |
| WO | WO2004104989 | 12/2004 |
| WO | WO2007144873 | 12/2007 |
| WO | WO2008016309 | 2/2008 |
| WO | 2013010080 A1 | 1/2013 |

OTHER PUBLICATIONS

Coates, John, Think small: low-cost optical spectral measurements for chemical sensing, Spectroscopy, Spectroscopyonline.com, http://www.spectroscopyonline.com/think-small-low-cost-optical-spectral-measurements-chemical-sensing, 2006, vol. 21, Issue 10.

Earnshaw's Theorem, Wikipedia, citation 2011, 1-6 http://en.wikipedia.org/wiki/Earnshaw%27s_theorem.

Gibbs et al., Is magnetic levitation possible?, Mar. 1997, 1-3 http://www.ru.nl/html/research/levitation/diamagnetic/levitation_possible/.

Hernandez-Sanchez et al., Detection of freeze injury in oranges by magnetic resonance imaging of moving samples, Appl. Magn. Reson. 2004, 26, 431-445.

Joliffe, I.T., Principal component analysis, second edition, Springer, 2002, 1-518.

Lucas et al., An iterative image registration technique with an application to stereo vision, Proceedings of imaging understanding workshop, 1981, 121-130.

Wright et al., NMR imaging of packaged foods, in book of M. Mathlouthi (ed.) Food Packaging and Preservation, Chapman & Hall, chapter 11, 1994, 197-209.

Tea et al. "1H-NMR-Based Metabolic Profiling of Maternal and Umbilical Cord Blood Indicates Altered Materno-Foetal Nutrient Exchange in Preterm Infants", PLoS ONE, vol. 7(1), Jan. 2012.

Ding et al., "Advances in Water Cut Metering with Low Field NMR", Department of Chemical and Petroleum Engineering, TIPM Laboratory, University of Calgary, Calgary, AB.

Dubois, "NeSSI (New Sampling/Sensor Initiative) Generation II Specification", A Conceptual and Functional Specification Describing the Use of Miniature, Modular Electrical Components for Adaptation to the ANSI/ISA SP76 Substrate in Electrically Hazardous Environments, Jun. 2004, Center for Process Analytical Chemistry, Seattle USA.

Arola, et al. Use of Nuclear Magnetic Resonance Imaging as a Viscometer for Process Monitoring, Chemical Engineering Science, vol. 52, No. 13, pp. 2049-2057, 1997.

Gunnerod et al., Highly automated drilling fluids system improves HSE and efficiency, reduced personnel needs, Drilling Contractor, Heath, Safety & Environment, Jan./Feb. 2009, 73-77.

(56) References Cited

OTHER PUBLICATIONS

Pohost et al., Nuclear magnetic resonance imaging: With or without nuclear?, JACC Mar. 1986, vol. 7, No. 3, 709-710.
The Instrumentation, Systems, and Automation Society, "Modular Component Interfaces for Surface-Mount Fluid Distribution Components-Part 1: Elastomeric Seals", ISA-76.00.02-2002, [https://www.isa.org/products/sa-76-00-02-2002-modular-component-interfaces-for], Jun. 13, 2002, 16 pages.

* cited by examiner

Decay for oil: identical in the 2 experiments

Decay for water: different in the 2 experiments

ACCURATE WATER CUT MEASUREMENT

BACKGROUND OF THE INVENTION

The oil industry has long been interested in the prediction of potential producibility and the proportion of water and oil that will be produced for hydrocarbon reservoirs, see e.g., U.S. Pat. Nos. 4,933,638, 5,838,155 and 8,185,315 which are incorporated herein as a reference. It is a long felt need to determine the 'water cut' (% water in drilling fluid mixture) by performing 2D T1/T2 measurements. Briefly, the 2 time variables for the decays are varied independently, and a 2D relaxation map is reconstructed by 2-dimensional inverse Laplace transform (ILT). The idea is that while both the water and oil fractions may each have heterogeneous T1 and T2 distributions, the probability for water and oil pools having both the same T1 and T2 is small, so that a 2D plot will show cross-peaks which are uniquely either water or oil. FIG. 1 shows an example. The assumption is that the cross-peak intensity close to the diagonal (where T1=T2) represents water, while the peaks most distant from the diagonal represent oil. The yellow arrow indicates the line for the 'water-cut', assigning everything to the right of the line to water, and everything to the left to oil. In a series of experiments at UCD, the NMR-derived water cut values were compared to the 'true' values (determined by 'retort' experiments). The agreement was close, but not close enough. For example, in the experiment shown here, the NMR determined value was 29.9%, while the true value was 28.6%. It is possible, that the cross peak indicated by the white arrow, which was assigned to water, actually represents oil.

BRIEF DESCRIPTION OF THE DRAWINGS

The present invention will be more readily understood from the description of preferred embodiments that follows made in conjunction with the accompanying drawings of which.

DESCRIPTION OF THE PREFERRED EMBODIMENTS

Figure 1:
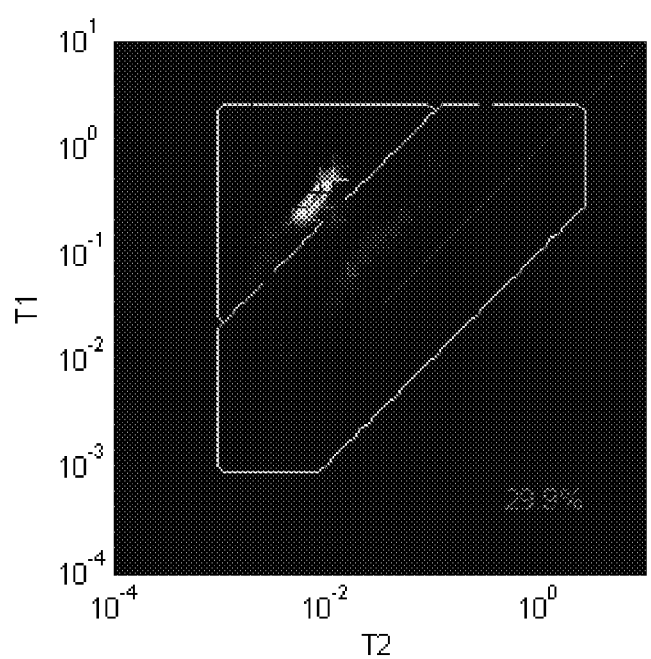
FIG. 1 shows an example of a 2D relaxation map.

In the following description, various aspects of the invention will be described. For the purposes of explanation, specific details are set forth in order to provide a thorough understanding of the invention. It will be apparent to one skilled in the art that there are other embodiments of the invention that differ in details without affecting the essential nature thereof. Therefore the invention is not limited by that which is illustrated in the figure and described in the specification, but only as indicated in the accompanying claims, with the proper scope determined only by the broadest interpretation of said claims.

As used herein, the term "NMR spectrometer", "NMR" and "analyzing module" interchangeably refers to any device that uses nuclear magnetic resonance to obtain information about a test substance.

As used herein, the term "imaging NMR spectrometer" refers to an NMR spectrometer that comprises means for providing a homogeneous magnetic field, at least one radio frequency coil, and magnetic gradient coils. An example of an imaging NMR spectrometer is an MRI instrument. As is well-known in the art, MRI has been used to obtain 2D or 3D images of the interior of such diverse objects as liquids, fruits, animals, and people. With an appropriate pulse sequence, MRI can be used to obtain velocity imaging. Examples of such pulse sequences can be found in Arola, D. F.; Barrall, G. A.; Powell, R. L.; McCarthy, K. L.; McCarthy, M. J. "Use of Nuclear Magnetic Resonance Imaging as a Viscometer for Process Monitoring," Chem. Eng. Sci. 52 (1997) 2049-2057, which is hereby incorporated in its entirety by reference.

As used herein, the term "fluid" refers to any material that can flow under a predetermined set of conditions. Non-limiting examples of fluids include liquids, non-Newtonian fluids, gases, solutions of solids or gases in liquids, suspensions of solids in liquids or gases, emulsions, and yield-stress materials.

Among the NMR-measurable properties, the diffusion coefficient (D) provides the most clear-cut distinction, differing by about 3 orders of magnitude between water and oil. It seems natural to try to involve a diffusion measurement in the water cut determination, either by expanding the T1/T2 experiment to a $3^{rd}$ dimension, or by replacing one of the dimensions (T1 or T2) by D. However, after crunching some numbers, the practical implementation appears to be technically challenging, if not impossible. The problem is that, in order for D to be an independent dimension for the ILT, we must somehow involve a PFGSTE (pulsed-field-gradient-stimulated-echo) sequence, in which the gradient amplitude is incremented while the times (TE and TM) are constant. A quick calculation shows that in order to reach high enough b-values, we need to apply quite long TE and TM values, so long that a significant fraction of spins (with short T1 and T2, both water and oil), will have decayed, which will make a quantitative evaluation of the cross peaks impossible.

A different approach is here disclosed and enabled, which is to incorporate the influence of diffusion into the CPMG-based T2 measurement. The technology is to conduct the standard T1/T2 experiment twice: In one scan without a field gradient during the CMPG echo train, and in a second scan with the application of a gradient. We assume that the first experiment is not influenced by diffusion, while in the second experiment the measured T2 (which we may call $T2_{app}$) will be affected by diffusion, but only for water. Therefore, we expect the cross peaks which represent water on the first T1/T2 spectrum to be shifted to lower T2 values on the second spectrum, while those representing oil should remain the same on both spectra, thereby removing the ambiguity in the cross peak assignments.

The observed effect is based on the following equation:

$$A(t; \tau) = \exp\left(-\frac{t}{T_2} - \frac{1}{3}g^2 D\tau^2 t\right)$$

A: the observed echo intensity; t: the actual echo time (in s); g: the applied gradient (in rps/mm); D: diffusion coefficient (in mm²/s); 2π: the inter-echo delay, or separation between the π pulses (in s); $T_2$: the 'intrinsic' T2, in the absence of diffusion effects (in s)

Thus, we can define an apparent T2 as:

$$\frac{1}{T_{2app}} = \frac{1}{T_2} + \frac{1}{3}g^2 D\tau^2$$

In the first scan, g=0, and the apparent T2 should be equal to the 'true' intrinsic T2. In the second scan we experience a shift (reduction in T2) defined by the second term in the above equation, but only for water, since for oil the value of D is so small that the second term is negligible. The above equations assume that the gradient g is constant throughout the measurement. In our case we will need to turn the gradient on and off between pulses, since we don't want it on during the RF pulses. As a result the additional relaxation term will be reduced by some 'duty cycle' factor depending on the actual length of the gradient pulses. Since we only want to see an effect and don't need to actually measure D, we don't care too much about the exact dependence.

Figure 2:
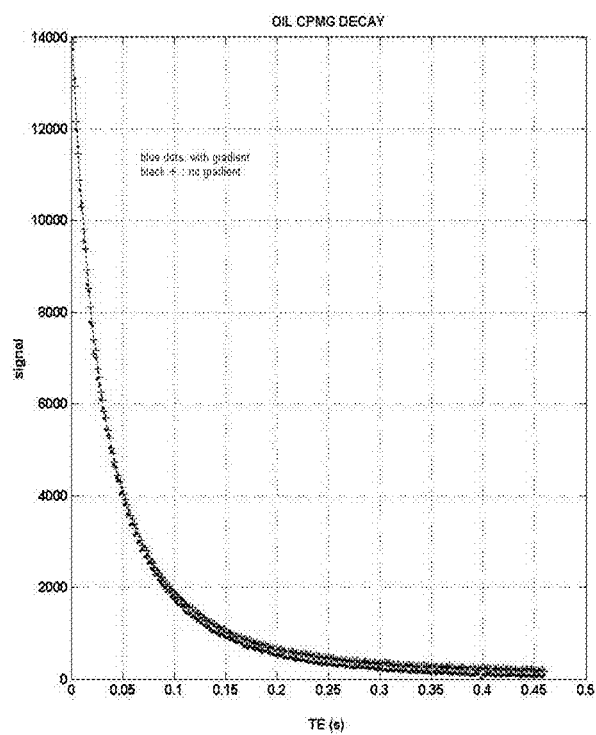
FIG. 2 illustrates decay for water (CPMG decay)
Figure 3:
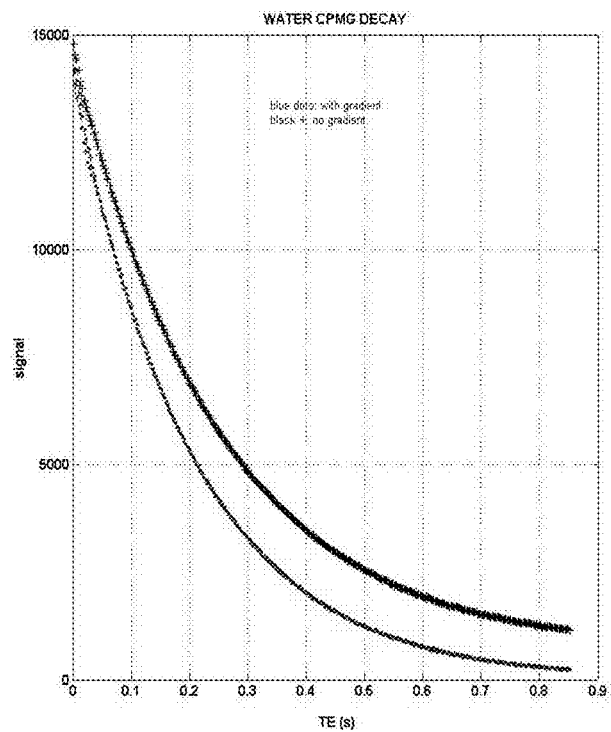
FIG. 3 illustrates decay for oil (CPMG decay).

Hence for example, a commercially available Aspect Imaging Ltd's M2 demo system was used. CPMG experiments were applied to small vials (separately) containing doped water and machine oil. The results of these respective experiments are illustrated in FIGS. 2 and 3. The inter-echo delay (2τ) was 1.7 ms, and the applied gradient 9122 Hz/mm—was applied between pulses (covering the echo acquisitions) for 0.66 ms+2×0.1 ms ramp time.

As FIG. 2 illustrates, the decay for water is different in the two experiments.

As FIG. 3 illustrates, the decay for oil is identical in the two experiments.

Figure 4:
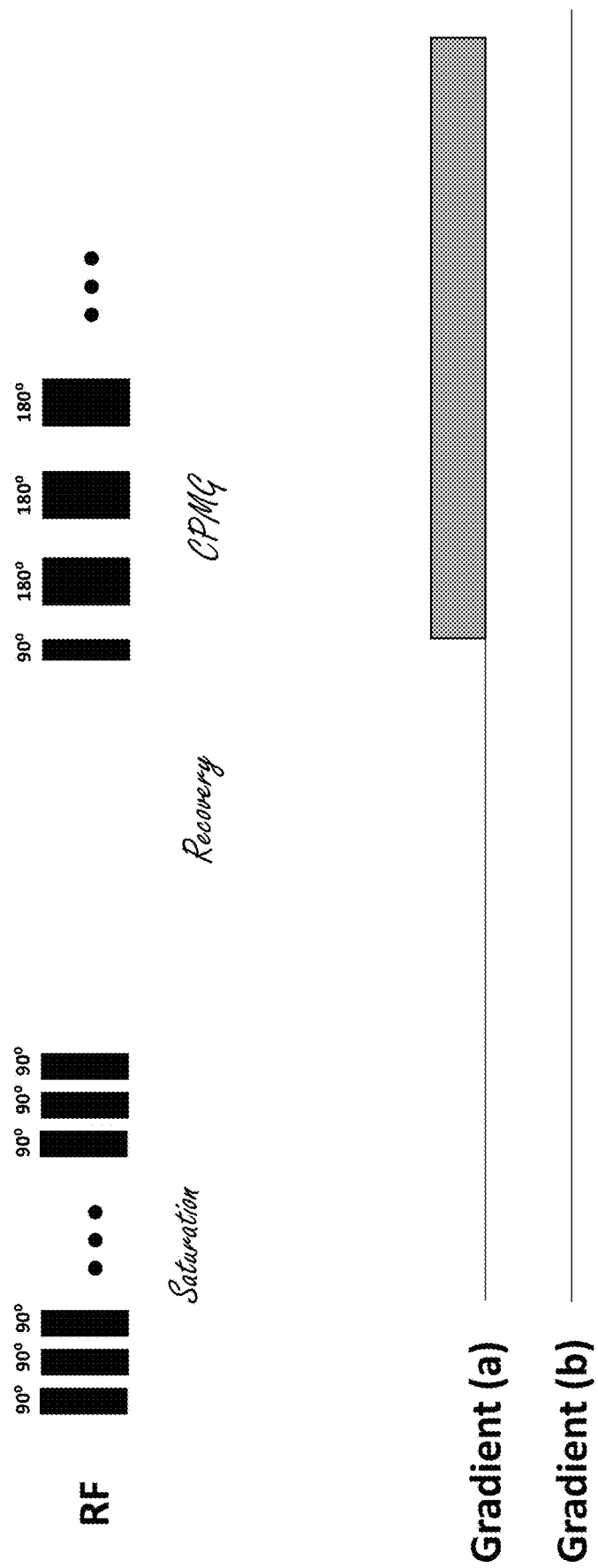
FIG. 4 illustrates two applications of a CPMG pulse sequence.

As FIG. 4 illustrates, in a first application of a CPMG pulse sequence, a gradient (a) is absent, and in a second application of a CPMG pulse sequence, a gradient (b) is applied.

According to an embodiment of the invention, and in a non-limiting manner, a method for incorporating the influence of diffusion into the CPMG-based T2 measurement for water cut measurement is provided. The method comprising steps of conducting a "standard T1/T2 experiment" at least twice by providing one scan without a field gradient during the CMPG echo train, and then providing a second scan with the application of a gradient; wherein in said second experiment the measured T2 ($T2_{app}$) is affected solely by water diffusion, thus shifting cross peaks which represent water on the first T1/T2 spectrum to lower T2 values on the second spectrum, while remaining those representing oil the same on both spectra, thereby removing the ambiguity in the cross peak assignments.

According to another embodiment of the invention, and in a non-limiting manner, an NMR-based system for measuring water cut off is disclosed. The system is operative in a method of conducting a "standard T1/T2 experiment" as known it the art, at least twice by providing at least one first one scan without a field gradient during the CMPG echo train, and then providing at least one second scan with the application of a gradient; wherein in said second experiment the measured T2 ($T2_{app}$) is affected solely by water diffusion, thus shifting cross peaks which represent water on the first T1/T2 spectrum to lower T2 values on the second spectrum, while remaining those representing oil the same on both spectra, thereby removing the ambiguity in the cross peak assignments.

According to another embodiment of the invention, and in a non-limiting manner, a method of analyzing physiological condition of a patient is presented. The method comprising steps of conducting a "standard T1/T2 experiment" at least twice by providing one scan without a field gradient during the CMPG echo train, and then providing a second scan with the application of a gradient; wherein in said second experiment the measured T2 ($T2_{app}$) is affected solely by water diffusion, thus shifting cross peaks which represent water on the first T1/T2 spectrum to lower T2 values on the second spectrum, while remaining those representing oil the same on both spectra, thereby removing the ambiguity in the cross peak assignments.

According to another embodiment of the invention, and in a non-limiting manner, an NMR-based system or otherwise any system comprising or in connection with an imaging NMR spectrometer configured for analyzing physiological condition of a patient is presented. The system is operative in a method of conducting a "standard T1/T2 experiment" at least twice by providing at least one first one scan without a field gradient during the CMPG echo train, and then providing at least one second scan with the application of a gradient; wherein in said second experiment the measured T2 ($T2_{app}$) is affected solely by water diffusion, thus shifting cross peaks which represent water on the first T1/T2 spectrum to lower T2 values on the second spectrum, while remaining those representing a fluid, including metabolic profiling; lipid analysis (including analysis of lipoproteins (notably low-density lipoprotein (LDL) and very low-density lipoprotein (VLDL), see Tea I, Le Gall G, Küster A, Guignard N, Alexandre-Gouabau M-C, et al. (2012) 1H-NMR-Based Metabolic Profiling of Maternal and Umbilical Cord Blood Indicates Altered Materno-Foetal Nutrient Exchange in Preterm Infants which is incorporated herein as a reference), blood analysis (including glucose measurement e.g., U.S. Pat. No. 5,685,300 which is incorporated herein as a reference; clot formation, e.g., EP Pat.2732046 which is incorporated herein as a reference, urea, fecal tissue, organ (including cancers in the head), including bones (measuring bone density and osteoporosis, e.g., U.S. Pat. No. 6,278,891 which is incorporated herein as a reference) the same on both spectra, thereby removing the ambiguity in the cross peak assignments.

According to an embodiment of the invention, and in a non-limiting manner, means and methods for determining oil and water content in core or emulsified fluid. Those means and methods are characterized by various benefits, such as that salinity doesn't affect measurements; emulsified content doesn't affect measurements; density doesn't affect measurements; electrical conductivity doesn't affect measurements; Gas/Vapor components don't affect measurements; use the meter as a process control tool whereas the said means and methods predict viscosity of the oil; detect the presence of solvents etc.

Drilling muds are very complex fluids used to drill oil wells; their functions are various: to carry the rock cuttings to the surface, to maintain a sufficient pressure against the rock formation, to lubricate and cool the bit. There are a few families of drilling muds: oil based muds (invert emulsion of brine into an oil phase with various additives) and water based muds (aqueous solutions of clays and polymers). Originally prepared from produced oil, oil based muds formulations have evolved to very complex compositions of various additives. The base oil may be of various nature, and additives are very complex: water droplets, surfactants, organophilic clays, viscosifyers, various solids and others. These additives give specific properties to the mud, particularly regarding rheological properties. Drilling muds are often described as thixotropic shear thinning fluids with a yield stress. Due to their complex composition, drilling muds exhibit an internal structure which is liable to modify according to the flowing and shear conditions, which may lead to non-homogenous phenomena. It is therefore important to develop investigation techniques allowing visualizing the internal structure of the fluid in parallel to rheological measurements.

As stated by Minghua Ding and Dave Lastock, "Advances in Water Cut Metering with Low Field NMR" (2004, only abstract is available), and as discussed in U.S. Pat. Nos. 5,497,087; 5,498,960; 4,785,245 which are incorporated herein as a reference, thermal recovery methods are widely used in heavy oil production. Under steam injection, the viscosity of oil will be significantly decreased and will be produced. With oil production, gas, steam and water will be produced simultaneously. The question of how to accurately meter oil, water and steam or gas content accurately comes up. Solving this problem and precisely measuring oil production rate in heavy oil production is becoming an increasingly important issue. The present invention provide useful an NMR-system or otherwise any system comprising or in connection with an imaging NMR spectrometer and methods for metering oil, water and steam or gas content accurately. The present invention also provide useful an NMR-system and Nessi-type methods for on-line feedbacking oil curding systems and subsystems configured to online feedback mud recycling steps selected from a group consisting of adding ingredients and raw materials, mixing, shaking, rotating, tumbling, aerating, heating, cooling, holding at a fixed temperature, emulsifying, adding water or water immiscible solutions, grinding, grounding, milling, shredding, pulvering, cutting, filtering, reducing particle size, de-emulsifying, kneading, decanting, setteling, destiling, decentering, vacuuming and any combination thereof.

According to an embodiment of the invention, and in a non-limiting manner, the aforesaid means and methods are provided useful, wherein at least one of the following is being held true (a) at least one of the analyzing modules is set for analyzing at least one criterion, parameter, value or characteristic of the drilling mud; (b) at least one of said analyzing modules is configured to generate at least one radial velocity profile; (c) at least one of said analyzing modules is configured for analyzing at least one criterion, parameter, value or characteristic of the drilling mud generates at least two radial pressure profiles; (d) at least one of said analyzing modules is set for analyzing at least one criterion, parameter, value or characteristic related with said mud's characteristic selected from a group consisting of specific gravity, density, salinity, rheology parameters, particle size, radius and distribution thereof, particles shape, especially particles smoothness versus their roughness, ruggedness, gruffness, choppedness, roughness, granulation, raggedness, raucousness, rustication or scabrousness, water content, water oil ratio (water cut), content of water-immiscible solutions, water to solvent ratio, and any combination thereof.

According to an embodiment of the invention, and in a non-limiting manner, an integrated multi-modality analyzing system (IMAS) for analysis and treatment of drilling mud, wherein said IMAS comprises: an outgoing recycled drilling mud sampling outlet in connection to a drilling rig (301); and an integrated multi-modality analyzing system coupled to said outlet, configured, by means of a plurality of analyzing modules, to provide a time resolved multi-layered profile of said mud sample; wherein said IMAS operative in a method of conducting a "standard T1/T2 experiment" at least twice by providing at least one first one scan without a field gradient during the CMPG echo train, and then providing at least one second scan with the application of a gradient; wherein in said second experiment the measured T2 ($T2_{app}$) is affected solely by water diffusion, thus shifting cross peaks which represent water on the first T1/T2 spectrum to lower T2 values on the second spectrum, while remaining those representing oil the same on both spectra, thereby removing the ambiguity in the cross peak assignments.

According to an embodiment of the invention, and in a non-limiting manner, the aforesaid IMAS is configured to be portable.

According to an embodiment of the invention, and in a non-limiting manner, the aforesaid IMAS is configured to operate in a method further comprising steps of connecting an outgoing recycled drilling mud sampling outlet to a drilling rig; coupling said outlet to a plurality of analyzing modules; analyzing said mud; obtaining, by means of a plurality of analyzing modules, a time resolved multi-layered profile of said mud sample; operatively communicating said profile or data thereof to said drilling rig, modules thereof, or to a mud recycling equipment.

According to an embodiment of the invention, and in a non-limiting manner, the aforesaid IMAS is configured to online feedback mud recycling steps selected from a group consisting of adding ingredients and raw materials, mixing, shaking, rotating, tumbling, aerating, heating, cooling, holding at a fixed temperature, emulsifying, adding water or water immiscible solutions, grinding, grounding, milling, shredding, pulvering, cutting, filtering, reducing particle size, de-emulsifying, kneading, decanting, setteling, destiling, decentering, vacuuming and any combination thereof.

According to an embodiment of the invention, and in a non-limiting manner, the aforesaid IMAS is provided useful wherein at least one of the following is being held true (a) at least one of said NMR-based analyzing modules is set for analyzing at least one criterion, parameter, value or characteristic of the drilling mud; (b) at least one of said analyzing modules is configured to generate at least one radial velocity profile; (c) at least one of said analyzing modules is configured for analyzing at least one criterion, parameter, value or characteristic of the drilling mud generates at least two radial pressure profiles; (d) at least one of said analyzing modules is set for analyzing at least one criterion, parameter, value or characteristic related with said mud's characteristic selected from a group consisting of specific gravity, density, salinity, rheology parameters, particle size, radius and distribution thereof, particles shape, especially particles smoothness versus their roughness, ruggedness, gruffness, choppedness, roughness, granulation, raggedness, raucousness, rustication or scabrousness, water content, water oil ratio (water cut), content of water-immiscible solutions, water to solvent ratio, and any combination thereof.

According to an embodiment of the invention, and in a non-limiting manner, the aforesaid IMAS is provided useful wherein said analyzing system comprises at least one member of a group consisting of thermometer, carbon dioxide analyzing means, including FTIR spectrometry gas analyzer, Atomic absorption spectroscopy (AAS), Atomic emission spectroscopy (AES), Atomic fluorescence spectroscopy (AFS), Alpha particle X-ray spectrometer (APXS), Capillary electrophoresis (CE), Chromatography, Colorimetry, Computed tomography, Cyclic Voltammetry (CV), Differential scanning calorimetry (DSC), Electron paramagnetic resonance (EPR, ESR), Energy Dispersive Spectroscopy (EDS/EDX), Field flow fractionation (FFF), Flow injection analysis (FIA), Gas chromatography (GC), Gas chromatography-mass spectrometry (GC-MS), Gas chromatography-IR spectroscopy (GC-IR), Gel permeation chromatography-IR spectroscopy (GPC-IR), High performance liquid chromatography (HPLC), High performance liquid chromatography-IR spectroscopy (HPLC-IR), Ion Microprobe (IM), Inductively coupled plasma (ICP), Ion selective electrode (ISE), Laser induced breakdown spectroscopy (LIBS), Liquid chromatography-IR spectroscopy (LC-IR), Liquid chromatography-mass spectrometry (LC-MS), Mass spectrometry (MS), Mossbauer spectroscopy, Neutron activation analysis, Nuclear magnetic resonance (NMR), Particle induced X-ray emission spectroscopy (PIXE), Pyrolysis gas chromatography mass spectrometry (PY-GC-MS), Raman spectroscopy, Refractive index, Resonance enhanced multiphoton ionization (REMPI), Transmission electron microscopy (TEM), Thermogravimetric Analysis (TGA), X-ray diffraction (XRD), X-ray fluorescence spectroscopy (XRF), X-ray microscopy (XRM), automatic or semi-automatic titrators, e.g., for chloride analysis by titration with a silver nitrate solution, for e.g., $Mg^{+2}$ analysis by titration with standard Vesenate solution, and any combination thereof.

According to an embodiment of the invention, and in a non-limiting manner, the aforesaid IMAS is provided useful wherein said analyzing system comprises at least one member of a group consisting of U-tube viscometers, Falling sphere viscometers, Oscillating Piston Viscometer, Vibrational viscometers, Rotational viscometers, Electromagnetically Spinning Sphere, Viscometer (including EMS Viscometers, Stabinger viscometer, Bubble viscometer, Micro-Slit Viscometers, Mooney-Line viscometer, NMR/MRI-bases viscometers etc) and any combination thereof.

According to an embodiment of the invention, and in a non-limiting manner, the aforesaid IMAS is provided useful wherein said analyzing system comprises at least one member of a group consisting of Pipe or Capillary rheometers, Rotational cylinder rheometers (Cone and plate, Linear Shear etc), extensional rheometers (Rheotens, CaBER, FiSER, Sentmanat etc.), and Other Types of Extensional Rheometers: Acoustic rheometes, Falling Plate rheometes, Capillary/Contraction Flow rheometes, Oscillating Disc Rheometer (ODR), Moving Die Rheometer (MDR) and any combination thereof.

According to an embodiment of the invention, and in a non-limiting manner, the aforesaid IMAS is provided useful analyzing system comprises at least one member of a group consisting of thermometer, carbon dioxide analyzing means, including FTIR spectrometry gas analyzer, Atomic absorption spectroscopy (AAS), Atomic emission spectroscopy (AES), Atomic fluorescence spectroscopy (AFS), Alpha particle X-ray spectrometer (APXS), Capillary electrophoresis (CE), Chromatography, Colorimetry, Computed tomography, Cyclic Voltammetry (CV), Differential scanning calorimetry (DSC), Electron paramagnetic resonance (EPR, ESR), Energy Dispersive Spectroscopy (EDS/EDX), Field flow fractionation (FFF), Flow injection analysis (FIA), Gas chromatography (GC), Gas chromatography-mass spectrometry (GC-MS), Gas chromatography-IR spectroscopy (GC-IR), Gel permeation chromatography-IR spectroscopy (GPC-IR), High performance liquid chromatography (HPLC), High performance liquid chromatography-IR spectroscopy (HPLC-IR), Ion Microprobe (IM), Inductively coupled plasma (ICP), Ion selective electrode (ISE), Laser induced breakdown spectroscopy (LIBS), Liquid chromatography-IR spectroscopy (LC-IR), Liquid chromatography-mass spectrometry (LC-MS), Mass spectrometry (MS), Mössbauer spectroscopy, Neutron activation analysis, Nuclear magnetic resonance (NMR), Particle induced X-ray emission spectroscopy (PIXE), Pyrolysis gas chromatography mass spectrometry (PY-GC-MS), Raman spectroscopy, Refractive index, Resonance enhanced multiphoton ionization (REMPI), Transmission electron microscopy (TEM), Thermogravimetric Analysis (TGA), X-ray diffraction (XRD), X-ray fluorescence spectroscopy (XRF), X-ray microscopy (XRM), automatic or semi-automatic titrators, e.g., for chloride analysis by titration with a silver nitrate solution, for e.g., $Mg^{+2}$ analysis by titration with standard Vesenate solution, and any combination thereof.

According to an embodiment of the invention, and in a non-limiting manner, the aforesaid IMAS is provided useful wherein said analyzing system comprises at least one member of a group consisting of U-tube viscometers, Falling sphere viscometers, Oscillating Piston Viscometer, Vibrational viscometers, Rotational viscometers, Electromagnetically Spinning Sphere, Viscometer (including EMS Viscometers, Stabinger viscometer, Bubble viscometer, Micro-Slit Viscometers, Mooney-Line viscometer, NMR/MRI-bases viscometers etc) and any combination thereof.

According to an embodiment of the invention, and in a non-limiting manner, the aforesaid IMAS is provided useful said analyzing system comprises at least one member of a group consisting of Pipe or Capillary rheometers, Rotational cylinder rheometers (Cone and plate, Linear Shear etc), extensional rheometers (Rheotens, CaBER, FiSER, Sentmanat etc.), and Other Types of Extensional Rheometers: Acoustic rheometes, Falling Plate rheometes, Capillary/Contraction Flow rheometes, Oscillating Disc Rheometer (ODR), Moving Die Rheometer (MDR) and any combination thereof.

NeSSI (New Sampling/Sensor Initiative) is a global and open initiative sponsored by the Center for Process Analysis and Control (CPAC), see ANSI/ISA 76.00.02-2002 Modular Component Interfaces for Surface-Mount Fluid Distribution Components—Part1: Elastomeric Seals," Instrumentation, Systems, and Automation Society (ISA), Compositional Analyzers Committee, (2002), www.isa.org.; Dubois, Robert N.; van Vuuren, Peter; Gunnell, Jeffrey J. "NeSSI (New Sampling/Sensor Initiative) Generation II Specification", A Conceptual and Functional Specification Describing the Use of Miniature, Modular Electrical Components for Adaptation to the ANSI/ISA SP76 Substrate in Electrically Hazardous Areas. Center for Process Analytical Chemistry (CPAC), University of Washington, Seattle Wash., (2003), incorporated herein as a reference.

Hence it is according to an embodiment of the invention, and in a non-limiting manner, the aforesaid IMAS is provided useful wherein it is configured for drilling mud, comprising recycling equipment configured to comply with a NeSSI specification.

What is claimed is:

1. A method for determining a distribution between oil and water in a fluid, the method comprising:
    performing, via an NMR spectrometer, a first measurement of the fluid, wherein the first measurement is taken without a field gradient during a CPMG pulse sequence of the first measurement;
    performing, via the NMR spectrometer, a second measurement of the fluid, wherein the second measurement is taken with a field gradient applied during a CPMG pulse sequence of the second measurement; and
    comparing the first measurement to the second measurement to determine the distribution between oil and water in the fluid,
    wherein:
        the first measurement is a first T1/T2 spectrum and the second measurement is a second T1/T2 spectrum,
        each of the T1/T2 spectra include a cross peak representing water and a cross peak representing oil,
        the cross peak representing oil in the first T1/T2 spectrum is substantially the same as the cross peak representing oil in the second T1/T2 spectrum, and the cross peak representing water in the second T1/T2 spectrum corresponds to a lower T2 value as compared to the cross peak representing water in the first T1/T2 spectrum.

2. The method of claim 1 wherein the fluid is drilling mud.

3. The method of claim 1 wherein the NMR spectrometer generates a first and a second radial pressure profile based on the first measurement and the second measurement, respectively.

4. The method of claim 1 wherein the first measurement, the second measurement or both are in-line measurements of drilling mud.

5. The method of claim 1, wherein the field gradient is applied during at least a CPMG pulse sequence of the second measurement.

* * * * *